(12) United States Patent
Helmus et al.

(10) Patent No.: US 8,902,562 B2
(45) Date of Patent: Dec. 2, 2014

(54) ELECTROSTATIC CLAMP, LITHOGRAPHIC APPARATUS AND METHOD OF MANUFACTURING AN ELECTROSTATIC CLAMP

(75) Inventors: Peter Richard Helmus, New Milford, CT (US); Ronald A. Wilklow, Fairfield, CT (US)

(73) Assignee: ASML Holdings N.V., Veldhoven (NL)

( * ) Notice: Subject to any disclaimer, the term of this patent is extended or adjusted under 35 U.S.C. 154(b) by 146 days.

(21) Appl. No.: 13/564,316

(22) Filed: Aug. 1, 2012

(65) Prior Publication Data

US 2013/0033690 A1 Feb. 7, 2013

Related U.S. Application Data

(60) Provisional application No. 61/514,320, filed on Aug. 2, 2011.

(51) Int. Cl.
*H01L 21/683* (2006.01)

(52) U.S. Cl.
CPC .................................. *H01L 21/6831* (2013.01)
USPC .......................................................... 361/234

(58) Field of Classification Search
USPC ........................................................... 361/234
See application file for complete search history.

(56) References Cited

U.S. PATENT DOCUMENTS

| 6,272,002 B1 * | 8/2001 | Mogi et al. ..................... 361/234 |
| 6,864,957 B2 | 3/2005 | Van Elp et al. |
| 2011/0102965 A1 * | 5/2011 | Fujisawa et al. .............. 361/234 |

FOREIGN PATENT DOCUMENTS

WO  WO 2010004915 A1 *  1/2010

\* cited by examiner

*Primary Examiner* — Scott Bauer
(74) *Attorney, Agent, or Firm* — Pillsbury Winthrop Shaw Pittman LLP

(57) ABSTRACT

An electrostatic clamp configured to electrostatically clamp an article to an article support in a lithographic apparatus. The clamp comprises a first layer of material, an electrode disposed over the first layer, an isolating, dielectric or semi-dielectric material deposited between portions of the electrode, and a second layer disposed over the electrode. Further, a method of manufacturing of the electrostatic clamp is described.

20 Claims, 9 Drawing Sheets

US 8,902,562 B2

ELECTROSTATIC CLAMP, LITHOGRAPHIC APPARATUS AND METHOD OF MANUFACTURING AN ELECTROSTATIC CLAMP

CROSS-REFERENCE TO RELATED APPLICATIONS

This application claims the benefit of priority from U.S. Provisional Patent Application Ser. No. 61/514,320, filed Aug. 2, 2011, the entire content of which is incorporated herein by reference.

FIELD

The present invention relates to an electrostatic clamp to hold an object, a lithographic apparatus including such a clamp, and a method relating to such a clamp.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, e.g. a mask (reticle), may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

An electrostatic clamp is a clamp that operates to clamp an object using electrostatic force. Such a clamp may be used in a lithographic apparatus. For example, a lithographic apparatus using extreme ultraviolet (EUV) radiation or electron beam radiation may operate in certain regions under vacuum conditions. An electrostatic clamp may be useful to clamp an object in such regions. An electrostatic clamp may be provided to electrostatically clamp an object, such as a mask or a substrate (wafer) to an object support, such as a mask table or substrate table, respectively.

SUMMARY

An electrostatic clamp may comprise a stack in which an electrode is disposed between an upper (first) and a lower (second) dielectric, semi-dielectric or isolating layer. For example, the electrode may be deposited on the upper surface of the lower layer. Then the upper layer is placed on top of the electrode. The upper and lower layers are bonded together with, for example, anodic bonding. The electrode may comprise a plurality of portions separated from each other.

According to an aspect, there is provided an apparatus having an electrostatic clamp configured to electrostatically clamp an article to an article support, the clamp comprising: a first dielectric or semi-dielectric layer; a second dielectric or semi-dielectric layer; an electrode between the first and second dielectric or semi-dielectric layers to form a stack, the electrode comprising a first portion and a lateral second portion; and an intermediate material between the first and second portions, the intermediate material being a dielectric, semi-dielectric or isolating material from other than the first or the second dielectric or semi-dielectric layer.

According to an aspect, there is provided an apparatus having an electrostatic clamp configured to electrostatically clamp an article to an article support, the clamp comprising: a first unitary dielectric or semi-dielectric layer; a second unitary dielectric or semi-dielectric layer; an electrode between the first and second unitary dielectric or semi-dielectric layers; and an intermediate material separate from the first and second unitary dielectric or semi-dielectric layers and extending between the first and second unitary dielectric or semi-dielectric layers to contact both the first and second unitary dielectric or semi-dielectric layers.

According to an aspect, there is provided an electrostatic clamp configured to electrostatically clamp an article to an article support in a lithographic apparatus, the clamp comprising: a first layer of material; an electrode disposed over the first layer; an isolating, dielectric or semi-dielectric material deposited between portions of the electrode; and a second layer disposed over the electrode.

According to an aspect, there is provided a method of manufacturing an electrostatic clamp configured to electrostatically clamp an article to an article support, the method comprising: disposing an electrode between a first and a second dielectric or semi-dielectric layer, the electrode having a first and a lateral second portion; and disposing an intermediate material between the first and second portions, the intermediate material being a dielectric, semi-dielectric or isolating material from other than the first or the second dielectric or semi-dielectric layer.

According to an aspect, there is provided an electrostatic clamp configured to electrostatically clamp an article against an article support, the electrostatic clamp manufactured according to a method described herein.

According to an aspect, there is provided a lithographic apparatus comprising: an article support constructed to support an article in a beam path of a radiation beam; and an electrostatic clamp as described herein.

According to an aspect, there is provided an apparatus, comprising: an article support constructed to support an article; and an electrostatic clamp as described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
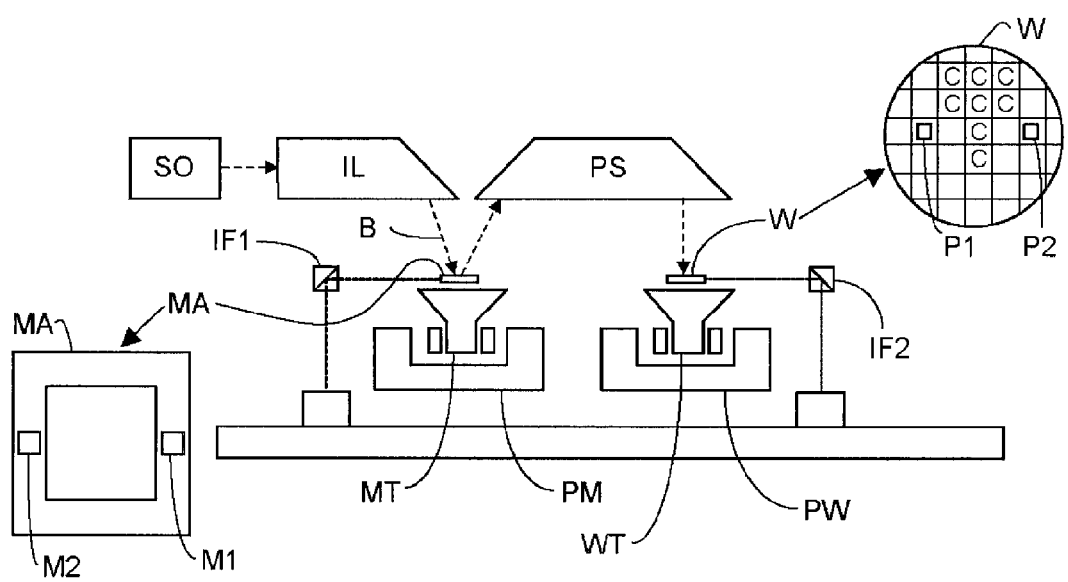
FIG. 1 depicts a lithographic apparatus in accordance with an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a support structure or support or patterning device support (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device. It may hold the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The support structure and the substrate table may also be hereinafter referred to as an article support. An article includes but is not limited to a patterning device, such as a reticle, and a substrate, such as a wafer.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more patterning device tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected by the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 2:
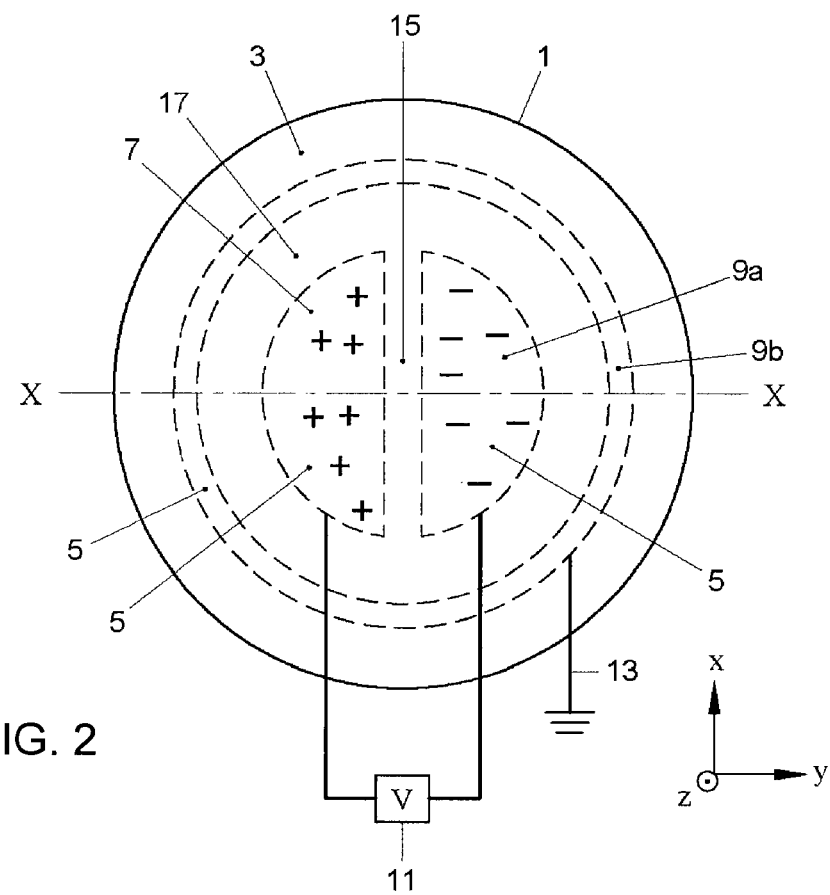
FIG. 2 depicts a plan view of an electrostatic clamp.

FIG. 2 depicts a plan view of an electrostatic clamp. As shown in FIG. 2, the electrostatic clamp 1 may form part of an article support 3. The article W, MA is disposed on the article support 3. To maintain the article W, MA supported in a stable manner on the support, the clamp 1 provides a clamping force, i.e., the article W, MA is attracted onto the article support 3, for instance, by electrostatic clamping. To this end, it will be understood that embodiments of the present invention may be applied to any article, in particular, a flat article. Examples of the article include an optical element, such as a reflective or transmissive mask, or a substrate to be processed, such as a wafer. While the description herein may refer to a mask MA and/or a wafer or substrate W as the article, it should be appreciated that the article may be something else.

The electrostatic clamp comprises an electrode 5. The electrode may comprise a first portion 7 and a second portion 9. The first portion 7 is a first electrode portion. The second portion 9 may be a second electrode portion 9a or a shielding electrode portion 9b.

Figure 3:
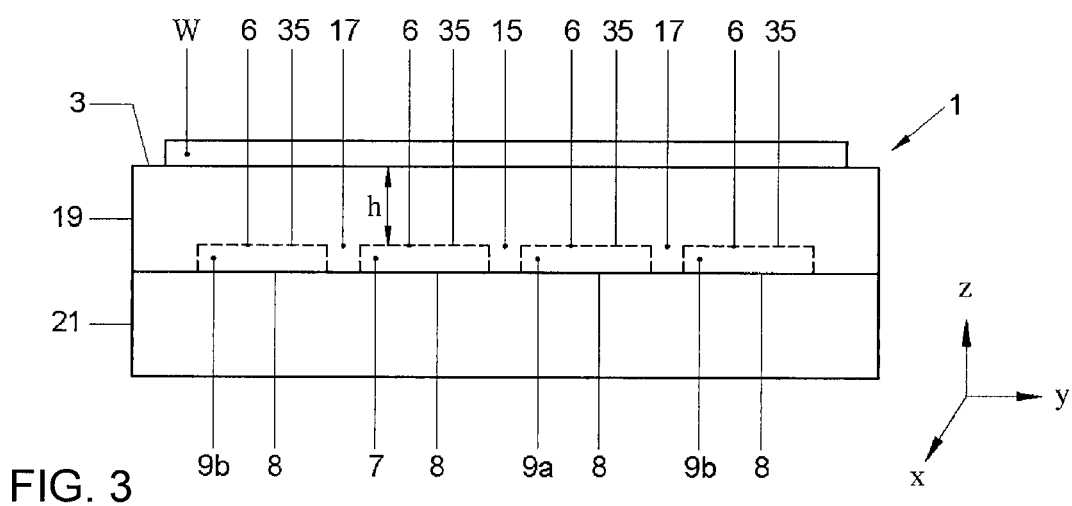
FIG. 3 depicts a cross section through X-X of the electrostatic clamp in FIG. 2.

A voltage supply 11 may be provided which is configured to supply a voltage to the first or second electrode portion 7, 9a. The shielding electrode portion 9b may be grounded by the provision of an earth connection 13. As shown in FIG. 3, the electrostatic clamp comprises a stack. The stack comprises the electrode 7, 9 disposed so that a first surface 6 of the electrode is in contact with a first dielectric or semi-dielectric layer 19 and a second surface 8 of the electrode is in contact with a second dielectric or semi-dielectric layer 21. The dielectric or semi-dielectric layers 19, 21 are provided in order to maintain a charge provided on at least the first portion 7. In FIG. 2, the electrode 7, 9 is depicted in dotted lines in order to indicate that the electrode is disposed in the stack structure of the electrostatic clamp 1. In other words, the electrode is not disposed on an outer surface of the clamp 1. Further, the electrical connections to the voltage supply 11 and earth 13 may also be provided within the stack structure of the electrostatic clamp 1.

The electrostatic clamp 1 operates by having an electrostatic charge built up and maintained on at least the first electrode portion 7. A force is generated in accordance with the following equation:

$$F = \tfrac{1}{2} * A * eps0 * V^2 / (d/epsr + g)^2$$

where F is force in Newtons, A is area in meters squared of the electrode to which a charge is applied, V is voltage in volts, g is the gap, if any, between the dielectric or semi-dielectric layer and the article (and is also the height of a protrusion, if any, between the dielectric or semi-dielectric layer and the article), epsr is the dielectric constant of the dielectric or semi-dielectric layer material, eps0 is the dielectric constant of vacuum or other ambient environment, and d is the distance between the electrode and the surface of the dielectric or semi-dielectric layer that is adjacent the article (and is the distance to the base of a protrusion, if any, between the dielectric or semi-dielectric layer and the article). Thus, the distance h between the article and the electrode is g+d, where d is greater than 0 if there is a gap between the article and the dielectric or semi-dielectric layer, e.g., due to a protrusion. In FIG. 3, the distance h between the electrode and the article is indicated. To hold the article W, a potential difference is applied between the electrode 5 and the article W. A potential difference of about 4 kV may be applied.

In FIG. 2, a bipolar clamp is provided in which a positive charge is established on the first portion 7 and a negative charge is established on the second portion 9a. In this way, the electrode may be attached to a controlled resistance in order to establish a certain electrostatic force to clamp the article. The shielding electrode portion 9b comprising the second portion 9b is provided in order to reduce the chance of a discharge occurring in accordance with the Paschen curve of the fluid, for example, gas, that is between the article and the dielectric or semi-dielectric layer.

FIG. 3 depicts a cross section of an electrostatic clamp through X-X in FIG. 2. In FIG. 3, the article support 3 is constructed to support an article to be processed, for example placed in a beam path of a radiation beam. The electrostatic clamp 1 is configured to electrostatically clamp the article W against the article support 3 during projection of the beam along the beam path. The electrostatic clamp 1 comprises a stack comprising a first and second layer 19, 21 and an electrode 7, 9a, 9b. The first layer may comprise a dielectric or semi-dielectric material. The second layer may comprise a dielectric, a semi-dielectric or an isolator material, or a combination thereof. It is not necessary that the second layer support an electric field. The electrode may comprise a first and a second portion 7, 9a, 9b, wherein the electrode 7, 9a, 9b is disposed so that a first surface 6 of the electrode 7, 9a, 9b is in contact with the first layer 19 and a second surface 8 of the electrode 7, 9a, 9b is in contact with the second layer 21. The first layer may be configured to receive the article. The first and second dielectric or semi-dielectric layer 19, 21 may comprise a dielectric or semi-dielectric material which supports an electrostatic field so that, in use, the electrostatic clamp electrostatically clamps the article against the first layer 19.

The material of either the first or the second dielectric or semi-dielectric layer may be provided between the first and second layer. In this way, an electrostatic clamp is provided which requires no gluing. In an embodiment, the material fills one or more volumes 15, 17 between the first and second layer 19, 21. The material may surround the electrode 7, 9a, 9b. In one embodiment, the material is provided between the first and second portions of the electrode 7, 9a, 9b. In an embodiment, the first and second layer comprises the same material. In this way, differences in thermal expansion coefficients of the first and second layer are ruled out, which results in a structure in which the effects of thermal stress is reduced.

In an embodiment, the electrode 7, 9a, 9b is disposed on one of the dielectric or semi-dielectric layers 19, 21. The electrode 7, 9a, 9b may extend in a plane, wherein the first and second portions 7, 9a, 9b extend in the plane. The electrode 7, 9a, 9b may be formed in the first and/or second dielectric or semi-dielectric layer 19, 21. In the embodiment shown in FIG. 3, the electrode 7, 9a, 9b is formed in the first dielectric or semi-dielectric layer 19. In the embodiment shown in FIG. 3, the electrode 7, 9a, 9b is formed in a recess 35 etched (e.g., acid etched) in the first or second dielectric or semi-dielectric layer resulting in protrusions 15, 17 between the electrode portions 7, 9a, 9b. The protrusions 15, 17 provide isolation areas or pools between the electrode 7, 9a, 9b portions, i.e., clamp zones. The electrode 7, 9a, 9b portions may then be formed by filling the recess 35 with a metal to form the electrode.

In an embodiment in which the article support is constructed to support an article MA capable of imparting a radiation beam with a pattern in its cross-section to form a patterned radiation beam in a beam path of the radiation beam. In a reflective lithographic apparatus, for example, one operating in an EUV radiation range, the article support for the patterning device (e.g., mask) and the electrostatic clamp may be constructed in a manner similar to that described for a substrate, since the beam is not transmitted through the patterning device. However, in a transmissive lithographic apparatuses, where the radiation beam is transmitted through the patterning device, the article support 3 and electrostatic clamp 1 may be constructed in order to allow the projection beam to pass through. This may be achieved by arranging the electrodes towards the edge of the electrostatic clamp.

The first and second layers may comprise a material such as an ultra low expansion material, such as ULE® titania silicate glass, a glass material, a ceramic material, a glass ceramic material, such as ZERODUR® material, or a combination thereof. U.S. Pat. No. 6,864,957, incorporated herein by reference in its entirety, discloses more details of a suitable material. ULE® material is an ultra-low-expansion glass available from Corning. ULE® material is a dielectric material, i.e. it is a poor conductor of electricity, but an efficient supporter of an electrostatic field. There is very little flow of charge in the material when the material is subject to an electrostatic field. The dielectric constant of ULE® material is about 4 at about 1 kHz. ZERODUR® material is a glass ceramic material, available from Schott, with an extremely low thermal expansion coefficient. ZERODUR® material is a semi-dielectric material, i.e. it is a poor conductor of electricity and an efficient supporter of an electrostatic field. ZERODUR® material has a dielectric constant of about 8 at about 1 kHz. It is noted that the dielectric constants vary with frequency. However, the voltage provided may be DC. A flow of charge in the material when in use does not compromise the clamping function of the electrostatic clamp. In this way, in spite of some charge flowing in the material, a semi-dielectric material, such as ZERODUR® material, may be used in the electrostatic clamp. The dielectric or semi-dielectric material may have a dielectric constant of between about 1 and about 8 at about 1 kHz.

In the embodiment shown in FIG. 3, the first layer 19, also referred to as the upper layer, is comprised of an ultra low expansion material, such as ultra low expansion glass available from Corning. The second layer 21 may be formed of the same material or another material. Ultra low expansion glass (e.g. ULE® material) is substantially non-expanding when subject to heat. If heated above a certain temperature, it may flow. In this way, by heating, ULE® can be cast in to a certain shape or form. Further, ULE® can be heated so that separate elements can be fused together to form complex structures. A further material which may be used for the first, second, or both layers 19, 21 is ZERODUR® material. ZERODUR® material is suitable for use in an electrostatic clamp, since in spite of being a semi-dielectric material, the current which flows in the material is not enough to substantially affect the function of the electrostatic clamp. In the embodiment shown in FIG. 3, the first and second layers are dielectric and are formed of ULE®. The electrode 7, 9a, 9b is formed of a conventional material, such as aluminum. The electrode 7, 9a, 9b may comprise a material of any metal which can be oxidized provided that the oxide layer which forms on the metal is not too thick to allow a voltage or earth connection to be applied to the electrode.

In an embodiment, the first, second, or both layers 19, 21 may have a thermal expansion of less than about 10 m/m·K× $10^{-6}$. The material of the first, second, or both layers 19, 21 may be SiC (silicon carbide which has a thermal expansion of 4 m/m·K×$10^{-6}$), SiSiC (siliconized silicon carbide which has a thermal expansion of 4 m/m·K×$10^{-6}$) or $Si_3N_4$ (silicon nitride, which has a thermal expansion 3.3 m/m·K×$10^{-6}$). The dielectric material may be, for example, a plastic such as PARYLENE™ poly(p-xylene) polymer of Para Tech Coating, Inc, KAPTON™ polymide or MYLAR™ polyester, both of E.I. du Pont de Nemours and Company or a liquid crystal polymer (LCP). Quartz such as SCHOTT™ sealing glass, SCHOTT™ AF37 or SCHOTT BOROFLOAT™ 33 may be used as a dielectric material. Another material that may be used as an insulator and/or dielectric may be boron nitride.

In an embodiment, the article support 1 and/or electrostatic clamp 3 may have a temperature control system to control the temperature of the article support 1 and/or electrostatic clamp 3. For example, the temperature control system may comprise one or ducts passing through the article support 1 and/or electrostatic clamp 3 and which may receive a fluid flow, e.g., a liquid flow, to cause heat transfer between the fluid and the article support 1 and/or electrostatic clamp 3.

Further, FIG. 3 is an example of an article support 1 and/or electrostatic clamp 3 in which an embodiment of the invention may be implemented or implemented as. Other types, formats and physical arrangements of electrostatic clamps (or more generally clamps having an electrode) may implement an embodiment of the invention as described herein.

Figure 4:
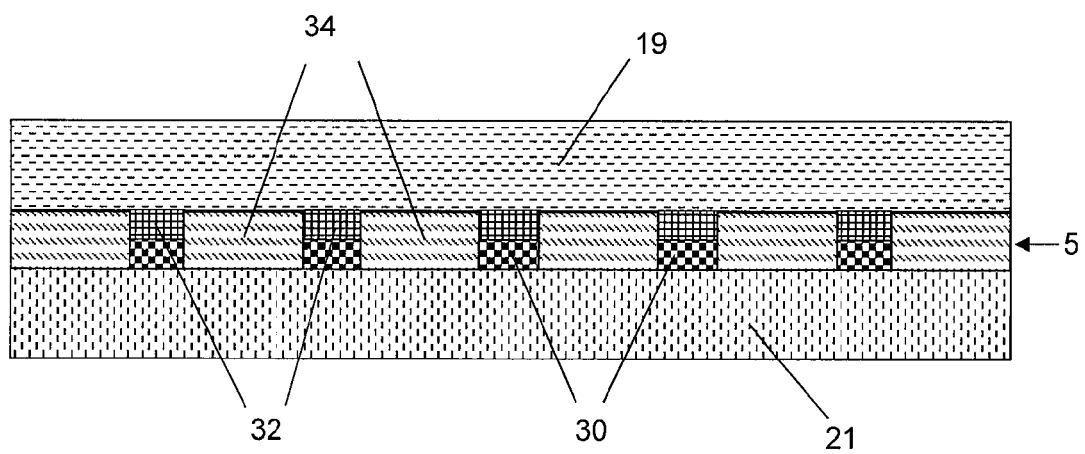
FIG. 4 depicts a partial cross section of a portion of an electrostatic clamp according to an embodiment of the invention.

FIG. 4 depicts a partial cross section of a portion of an electrostatic clamp according to an embodiment of the invention. In the embodiment shown in FIG. 4, the electrostatic clamp comprises an electrode 5 disposed between a first dielectric or semi-dielectric layer 19 and a second dielectric or semi-dielectric layer 21 to form a stack. In an embodiment, the electrode 5 is disposed on the dielectric or semi-dielectric layer 19 and then the dielectric or semi-dielectric layer 21 is disposed on the electrode 5 (which is disposed on the dielectric or semi-dielectric layer 19). In an embodiment, the electrode 5 is disposed on the dielectric or semi-dielectric layer 21 and then the dielectric or semi-dielectric layer 19 is disposed on the electrode 5 (which is disposed on the dielectric or semi-dielectric layer 21). In an embodiment, a portion of the electrode 5 is disposed on the dielectric or semi-dielectric layer 19 and a portion is disposed on the dielectric or semi-dielectric layer 21 and the portions of the electrode 5 and the layers 19, 21 are then brought together.

In an embodiment, the electrode 5 comprises aluminum. In an embodiment, the electrode 5 comprises two layers 30, 32. In an embodiment, one of the layers 30, 32 comprises chrome and the other of the layers 30, 32 comprises aluminum. In an embodiment, layer 32 comprises chrome and layer 30 comprises aluminum. In an embodiment, the one of the layers 30, 32 has a thickness of about 30 nm and the other of the layers 30, 32 has a thickness of about 300 nm. In an embodiment, the one of the layers 30, 32 has a thickness of 30 nm comprises chrome and the other of the layers 30, 32 that has a thickness of 300 nm comprises aluminum. In an embodiment, the electrode may comprise a single layer of metal, multiple layers of a same metal, or multiple layers of different metal.

The electrode 5 has portions separated from each by an intermediate material 34. In an embodiment, the intermediate material 34 is a dielectric, semi-dielectric or isolating material. In an embodiment, the intermediate material 34 comprises silicon dioxide. The electrode 5 portions may be separate individual electrode portions like first and second portions 7, 9a. The electrode 5 portions may be different parts of a unitary electrode 9b separated by, for example, the intermediate protrusions 15, 17.

Further, while intermediate material 34 may be the same material as first layer 19 and/or second layer 21, the intermediate material 34 is separate from the unitary first layer 19 material and the unitary second layer 21 material. As discussed below, the intermediate material 34 is coated, deposited or otherwise provided in the spacing between the electrode 5 portions and is separately coated, deposited or otherwise provided from the unitary first layer 19 material and the unitary second layer 21 material.

In an embodiment, one or both of the dielectric or semi-dielectric layers 19, 21 has a generally planar surface that interfaces with the electrode 5 and the intermediate material 34.

FIGS. 5(A)-(I) depict the manufacture of an electrostatic clamp as depicted, for example, in FIG. 4 according to an embodiment of the invention.

In an embodiment, the method comprises manufacturing an electrostatic clamp configured to electrostatically clamp an article to an article support, the method comprising: disposing an electrode between a first and a second dielectric or semi-dielectric layer to form a stack, wherein the electrode comprises a first and a second portion and an intermediate material lies between the first and second portions, the intermediate material being a dielectric, semi-dielectric or isolating material from other than the first or the second dielectric or semi-dielectric layer.

Figure 5A:
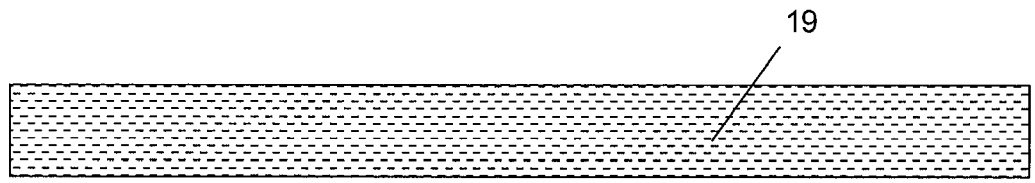
FIGS. 5(A)-(I) depict a partial cross section view of an embodiment of a method to manufacture the portion of an electrostatic clamp as depicted in FIG. 4.

Referring FIG. 5(A), the process begins with the dielectric or semi-dielectric layer 19. In an embodiment, layer 19 may comprise an ultra low expansion material (such as ULE® material), a glass material, a ceramic material, a glass ceramic material (such as ZERODUR® material), or a combination thereof. In an embodiment, layer 19 comprises a glass and/or ceramic material.

Figure 5B:
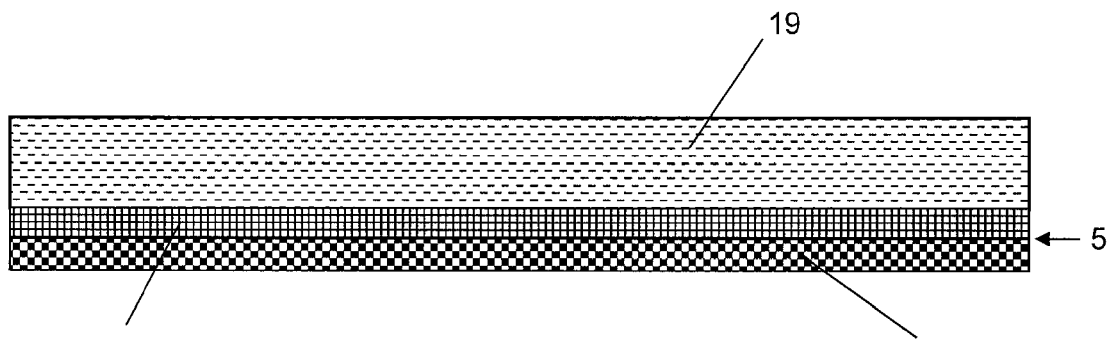

Referring to FIG. 5(B), an electrode material 5 is disposed on the layer 19. In an embodiment, the electrode material 5 comprises a first electrode material layer 30 and a second electrode material layer 32. In an embodiment, the first electrode material layer 30 comprises aluminum and the second electrode material layer 32 comprises chrome. Both layers 30, 32 may be applied once or sequentially. In an embodiment, the electrode material 5 is coated on the layer 19. In an embodiment, the electrode material 5 is deposited by a sputtering process, a chemical vapor deposition process or a combination thereof. The thickness of the electrode 5 may be controlled by controlling the time of the deposition process. In an embodiment, the electrode material 5 has a thickness selected from the range of 260 nm to 370 nm. In an embodiment, the thickness is about 330 nm. In an embodiment, of a thickness of about 330 nm, about 300 nm may be aluminum and about 30 nm may be chrome.

Figure 5C:
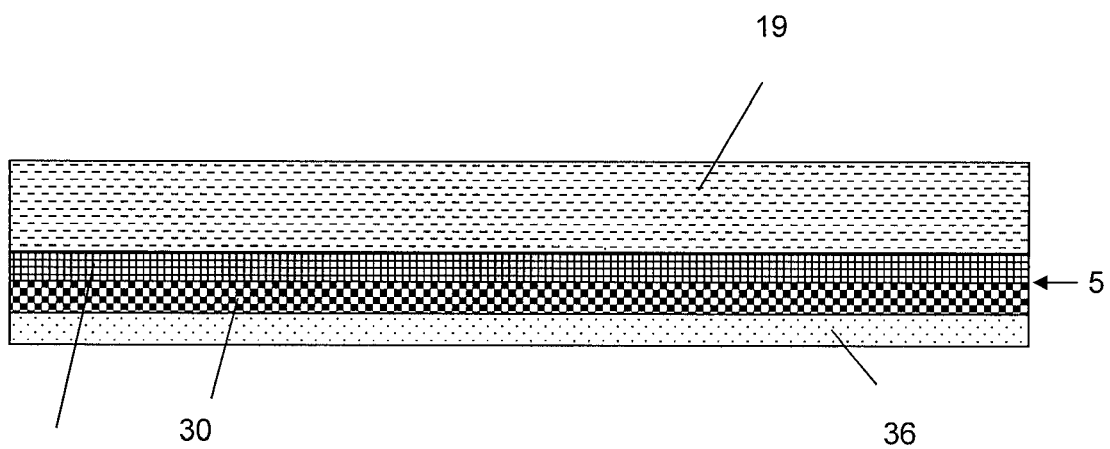

Referring to FIG. 5(C), a masking material 36 is disposed on or over the electrode material 5. In an embodiment, the masking material 36 comprises a photoresist. In an embodiment, the photoresist is a positive photoresist. In FIG. 5(C), the resist is a positive resist, however the process may be readily modified to accommodate a negative resist instead. In an embodiment, the masking material 36 may comprise an imprintable medium that may be imprinted using an imprint lithography template.

Figure 5D:
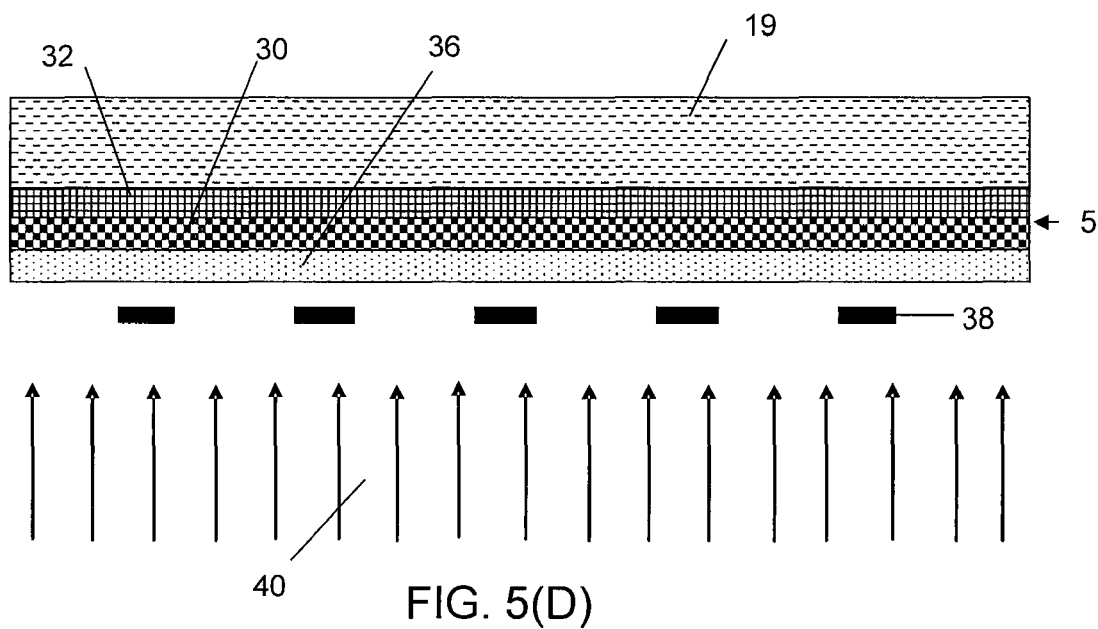
Figure 5E:
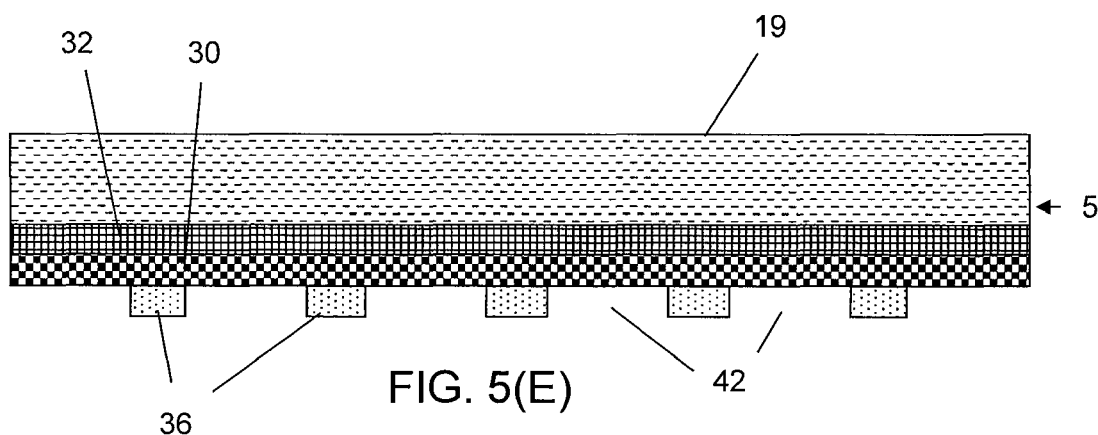

Referring to FIG. 5(D), the masking material 36 has or is provided a pattern of one or more apertures (see FIG. 5(E)). In FIG. 5(D), for example, the pattern is provided to the masking material 36 using a mask structure 38. In an embodiment, the mask structure 38 is a photomask exposed to radiation 40 in order to provide the pattern to the masking material 36 by exposing the masking material 36 to the radiation 40. While FIG. 5(D) shows the mask structure 38 displaced from the masking material 36, it need not be and could instead be on the surface of the masking material 36 opposite the electrode 5. As discussed above, in an embodiment, the mask structure 38 may be an imprint lithography template. In an embodiment, the mask structure 38 may be a radiation outlet that provides a beam of radiation in the desired pattern. For example, the radiation outlet may be an e-beam writer or a spatial modulator emitting a patterned or moving beam of radiation to provide the pattern. In an embodiment, the masking material 36 may have the pattern embedded therein when the masking material 36 is disposed on or over the electrode 5. For example, the masking material 36 may be a patterned etch resistant plate having one or more apertures 42 that is removably disposed on or over the electrode 5.

Referring to FIG. 5(E), in an embodiment where the masking material 36 is a positive resist, the radiation exposed masking material 36 is developed to remove the exposed masking material 36 to expose the electrode 5. As a result, one or more apertures 42 of the pattern are formed in the masking material 36. In an embodiment that is not shown, a portion of the electrode material 5 corresponding to the exposed masking material 36 may be removed essentially at the same time as the exposed masking material 36. In such a case, the structure would look like that shown in FIG. 5(G).

Figure 5F:
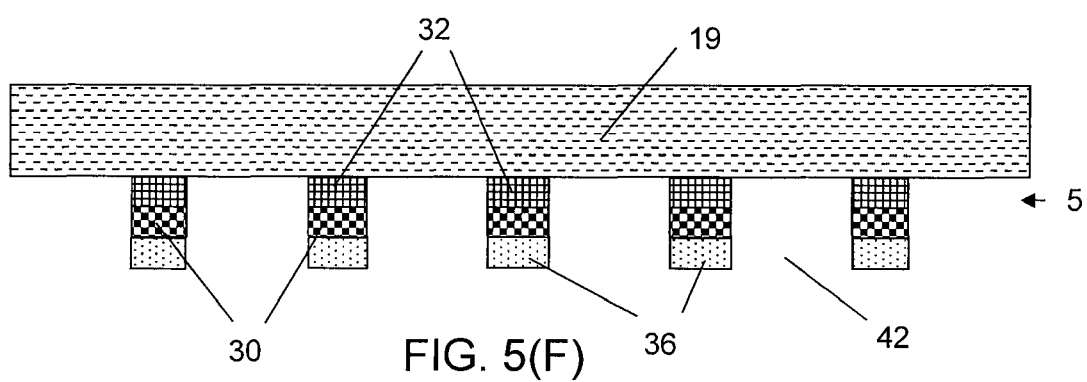

Referring to FIG. 5(F), the patterned masking material 36 is used to transfer its pattern into the electrode 5. The one or more apertures 42 expose the electrode material 5. Thus, the one or more apertures 42 of the masking material 36 can be used to form the pattern of the masking material 36 into the electrode material 5 as shown in FIG. 5(F). For example, an etch may be used to remove electrode material 5 through the one or more apertures 42. In an embodiment, the etch substantially completely removes the electrode material 5 in the one or more apertures to expose layer 19. In an embodiment, the etch comprises a chemical etch process.

Figure 5G:
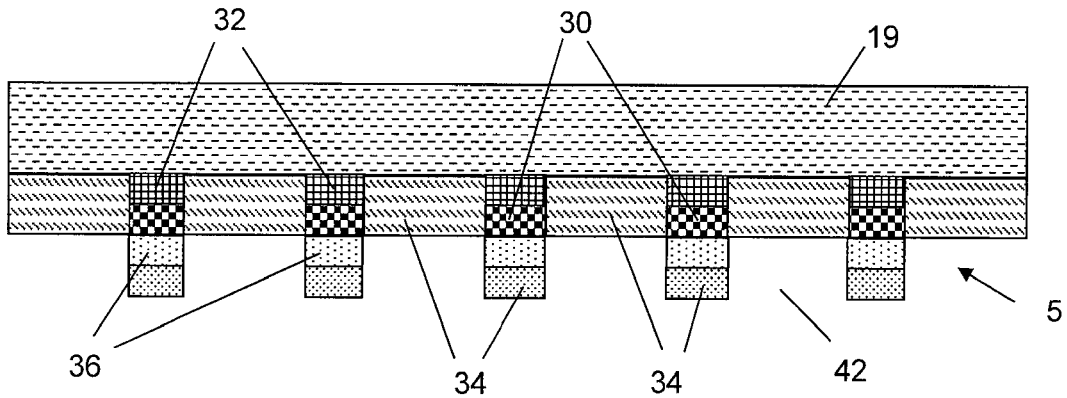

Referring to FIG. 5(G), an intermediate material 34 is provided to the one or more apertures 42. In an embodiment, the intermediate material 34 is provided to the layer 19 and in contact with adjacent electrode material 5. In an embodiment, the intermediate material 34 is provided to substantially the same height from the layer 19 as the remaining electrode material 5. In an embodiment, the intermediate material 34 may, in addition to being provided in the one or more apertures 42, be provided on the remaining masking material 36 as shown in FIG. 5(G). In an embodiment, the intermediate material 34 comprises silicon dioxide. The intermediate material 34 is material other than from layer 19 or from layer 21 (not shown in FIG. 5(G)), however it may be of the same material, i.e., substance.

Figure 5H:
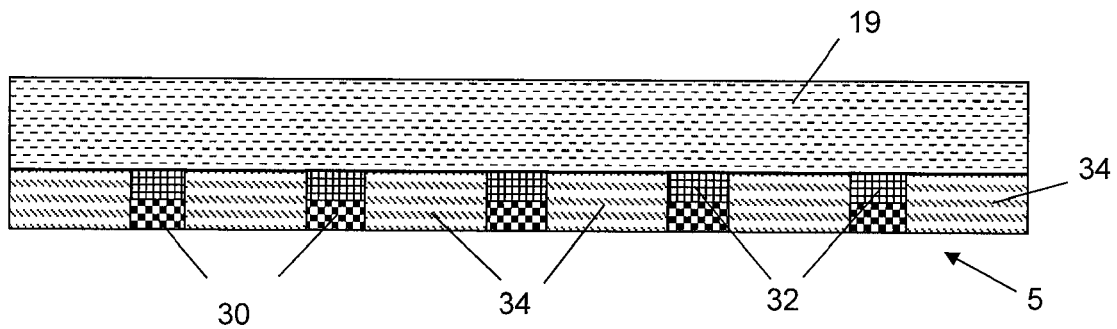

Referring to FIG. 5(H), the remaining masking material 36 is removed. Where there is intermediate material 34 on the remaining masking material 36, such intermediate material 34 is removed along with the remaining masking material 36. In an embodiment, a solvent may be used to dissolve the remaining masking material 36 and thus cause the intermediate material 34 thereon to be removed as well. This method may be referred to as a lift off process in the art. In an embodiment, where intermediate material 34 may be selectively provided to the one or more apertures 42 in the electrode 5, the remaining masking material 36 may be removed before such selective provision of the intermediate material 34. In an embodiment, after removal of the remaining masking material 36, the remaining electrode 5 and intermediate material 34 may be polished or otherwise smoothened using, for example, an abrasive or a chemical treatment. In an embodiment, the remaining electrode 5 and intermediate material 34 may be cleaned by, for example, a chemical treatment.

Figure 5I:
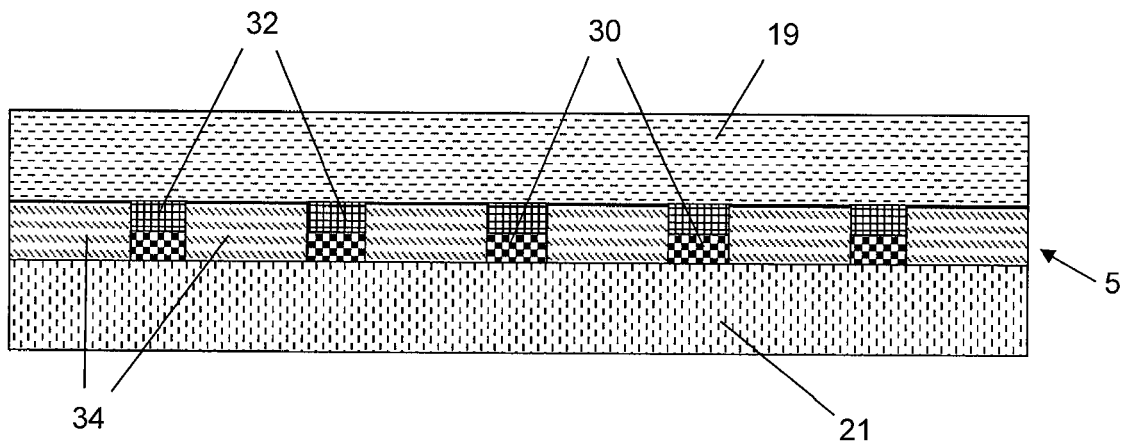

Referring to FIG. 5(I), the layer 19 on which the electrode 5 is disposed is fused or bonded to the second dielectric or semi-dielectric layer 21 to form a stack. In an embodiment, layer 21 may comprise an ultra low expansion material (such as ULE® material), a glass material, a ceramic material, a glass ceramic material (such as ZERODUR® material), or a combination thereof. In an embodiment, layer 21 comprises a glass and/or ceramic material.

FIGS. 6(A)-(I) depict the manufacture of an electrostatic clamp as depicted, for example, in FIG. 4 according to a further embodiment of the invention. In this embodiment, the transfer step (e.g., etch) using the masking material 36 into the electrode 5 may be avoided.

Figure 6A:
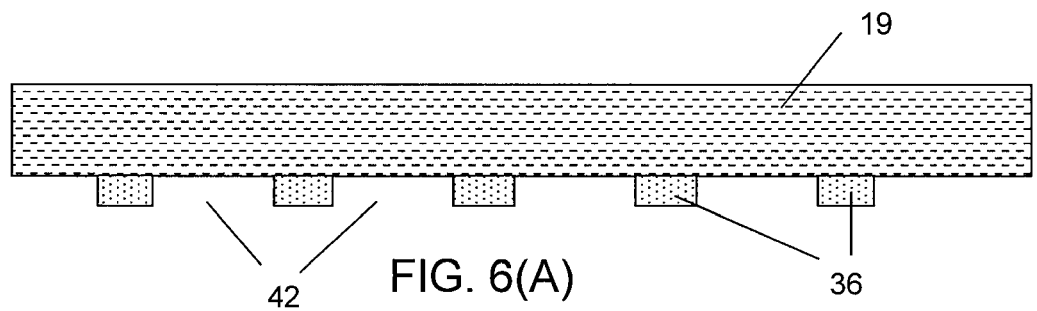
FIGS. 6(A)-(I) depict a partial cross section view of a further embodiment of a method to manufacture the portion of an electrostatic clamp as depicted in FIG. 4.

Referring FIG. 6(A), a masking material 36 is disposed on or over the layer 19. In an embodiment, layer 19 may comprise an ultra low expansion material (such as ULE® material), a glass material, a ceramic material, a glass ceramic material (such as ZERODUR® material), or a combination thereof. In an embodiment, layer 19 comprises a glass and/or ceramic material. In an embodiment, the masking material 36 comprises a photoresist. In an embodiment, the photoresist is a positive photoresist. In FIG. 6(A), the resist is a positive resist, however the process may be readily modified to accommodate a negative resist instead. In an embodiment, the masking material 36 may comprise an imprintable medium that may be imprinted using an imprint lithography template. The masking material 36 has or is provided a pattern of one or more apertures 42. The one or more apertures 42 may be formed or provided as discussed above in relation to, for example, FIGS. 5(D) and 5(E). The one or more apertures 42 may extend to the layer 19.

Figure 6B:
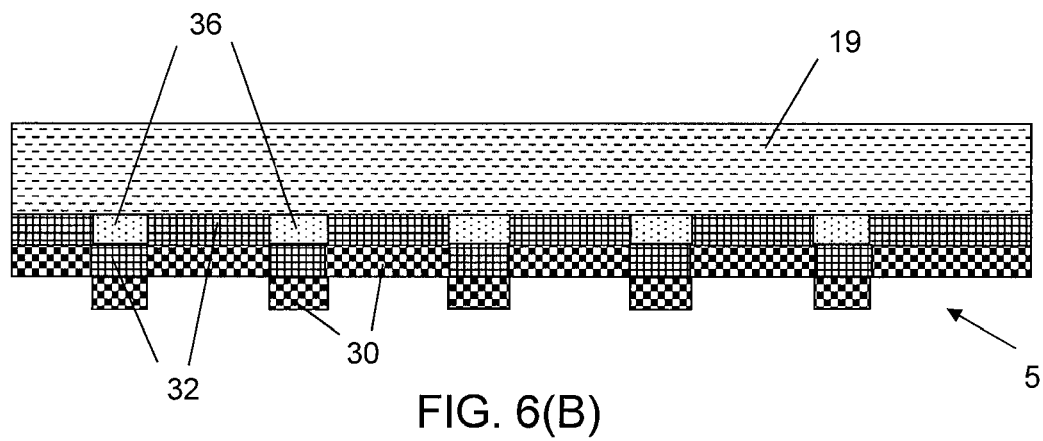

Referring to FIG. 6(B), an electrode material 5 is disposed in the one or more apertures 42 of the masking material 36. In an embodiment, the electrode material 5 comprises a first electrode material layer 30 and a second electrode material layer 32. In an embodiment, the first electrode material layer 30 comprises aluminum and the second electrode material layer 32 comprises chrome. Both layers 30, 32 may be applied once or sequentially. In an embodiment, the electrode material 5 is coated on the layer 19. In an embodiment, the electrode material 5 is deposited by a sputtering process, a chemical vapor deposition process or a combination thereof. The thickness of the electrode 5 may be controlled by controlling the time of the deposition process. In an embodiment, the electrode material 5 has a thickness selected from the range of 260 nm to 370 nm. In an embodiment, the thickness is about 330 nm. In an embodiment, of a thickness of about 330 nm, about 300 nm may be aluminum and about 30 nm may be chrome. In an embodiment, the electrode material 5 may, in addition to being provided in the one or more apertures 42, be provided on the remaining masking material 36 as shown in FIG. 6(B).

Figure 6C:
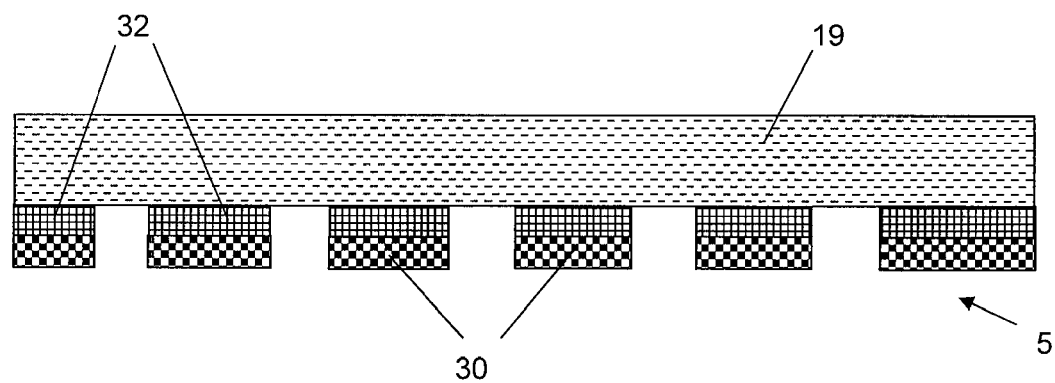

Referring to FIG. 6(C), the remaining masking material 36 is removed. Where there is electrode material 5 on the remaining masking material 36, such electrode material 5 is removed along with the remaining masking material 36. In an embodiment, a solvent may be used to dissolve the remaining masking material 36 and thus cause the electrode material 5 thereon to be removed as well. This method may be referred to as a lift off process in the art. In an embodiment, where the electrode material 5 may be selectively provided to the one or more apertures 42, the remaining masking material 36 may be removed before such selective provision of the electrode material 5.

Figure 6D:
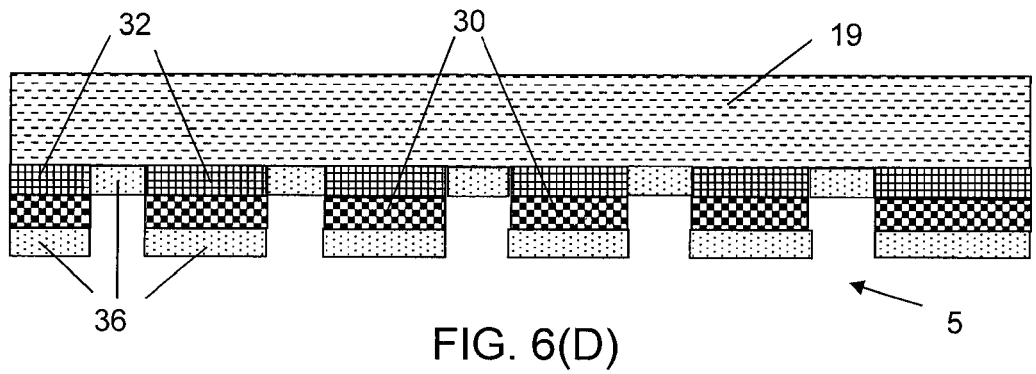

Referring FIG. 6(D), a further masking material 36 is disposed on or over the electrode 5 and on the exposed layer 19. In an embodiment, where intermediate material 34 may be selectively provided to the one or more apertures 42 in the electrode 5, the further masking material 36 may not need to be used and thus the method may proceed to FIG. 6(G). In an embodiment, the further masking material 36 comprises a photoresist. In an embodiment, the photoresist is a positive photoresist. In FIG. 6(D), the resist is a positive resist, however the process may be readily modified to accommodate a negative resist instead. In an embodiment, the further masking material 36 may comprise an imprintable medium that may be imprinted using an imprint lithography template.

Figure 6E:
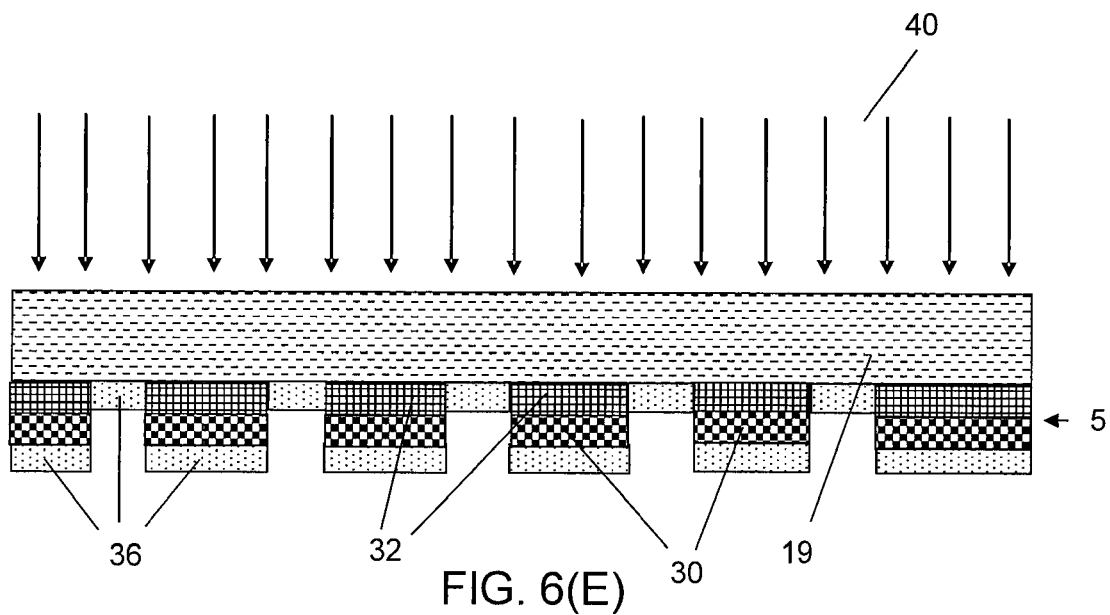
Figure 6F:
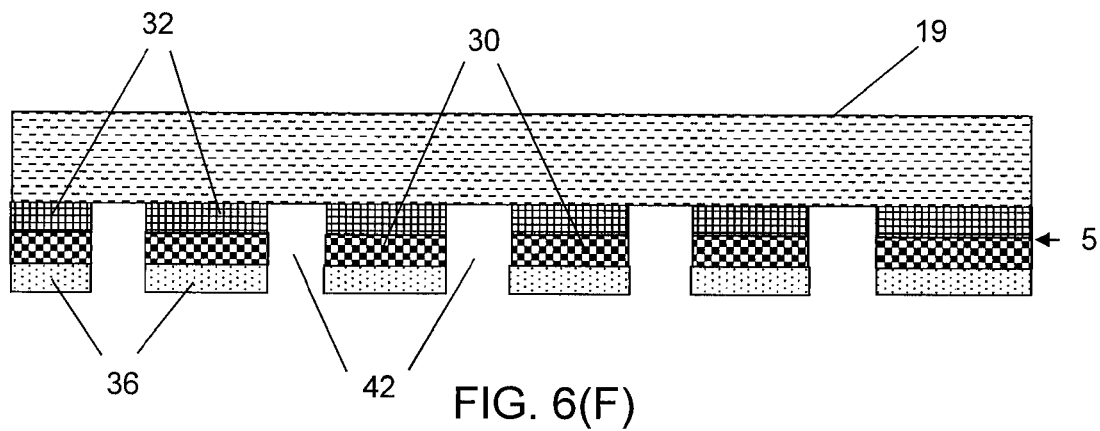

Referring to FIGS. 6(E) and (F), the further masking material 36 has or is provided a pattern of one or more apertures 42. In FIG. 6(E), for example, the pattern is provided to the further masking material 36 by using the electrode 5 as a mask and exposing the further masking material in the one or more apertures 42 to radiation 40. In an embodiment where the further masking material 36 is a positive resist, the radiation exposed masking material 36 in the apertures 42 is developed to remove the exposed further masking material 36 in order to expose the layer 19. Unexposed further masking material 36 remains on the electrode 5. As discussed above, the one or more apertures 42 in the further masking material 42 may be provided or formed by other mechanisms and methods.

Figure 6G:
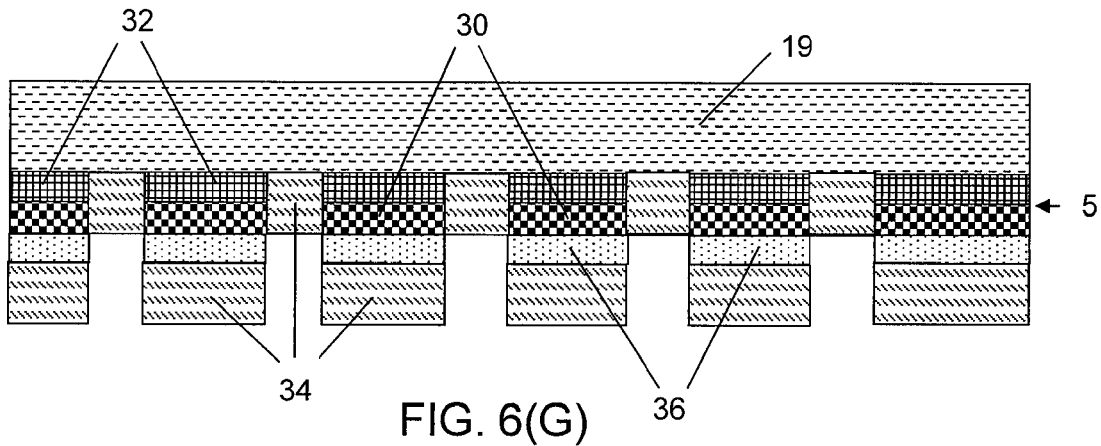

Referring to FIG. 6(G), an intermediate material 34 is provided to the one or more apertures 42. In an embodiment, the intermediate material 34 is provided to the layer 19 and in contact with adjacent electrode material 5. In an embodiment, the intermediate material 34 is provided to substantially the same height from the layer 19 as the remaining electrode material 5. In an embodiment, the intermediate material 34 may, in addition to being provided in the one or more apertures 42, be provided on the remaining further masking material 36, if any, as shown in FIG. 6(G). In an embodiment, the intermediate material 34 comprises silicon dioxide. The intermediate material 34 is material other than from layer 19 or from layer 21 (not shown in FIG. 6(G)), however it may be of the same material, i.e., substance.

Figure 6H:
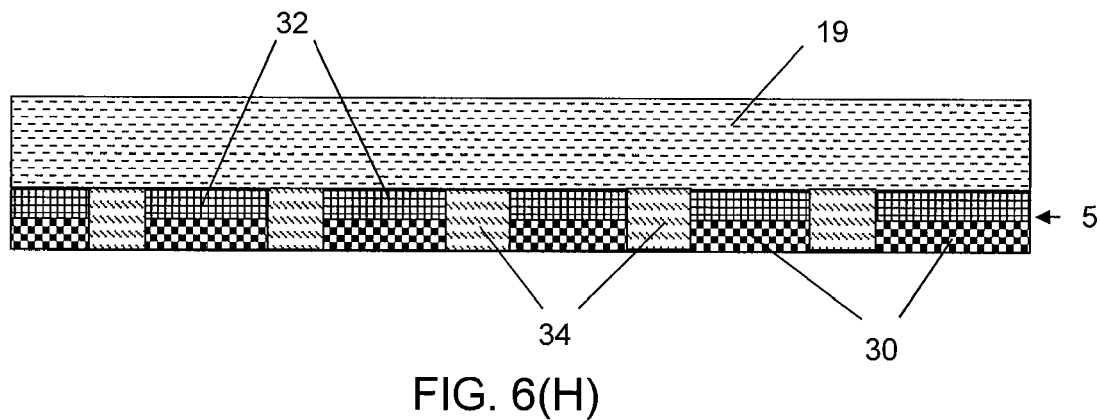

Referring to FIG. 6(H), the remaining further masking material 36, if any, is removed. Where there is intermediate material 34 on the remaining masking material 36, such intermediate material 34 is removed along with the remaining masking material 36. In an embodiment, a solvent may be used to dissolve the remaining masking material 36 and thus cause the intermediate material 34 thereon to be removed as well. This method may be referred to as a lift off process in the art.

In an embodiment, after provision of the intermediate material 34 and removal of the remaining masking material 36, if any, the remaining electrode 5 and intermediate material 34 may be polished or otherwise smoothened using, for example, an abrasive or a chemical treatment. In an embodiment, the remaining electrode 5 and intermediate material 34 may be cleaned by, for example, a chemical treatment.

Figure 6I:
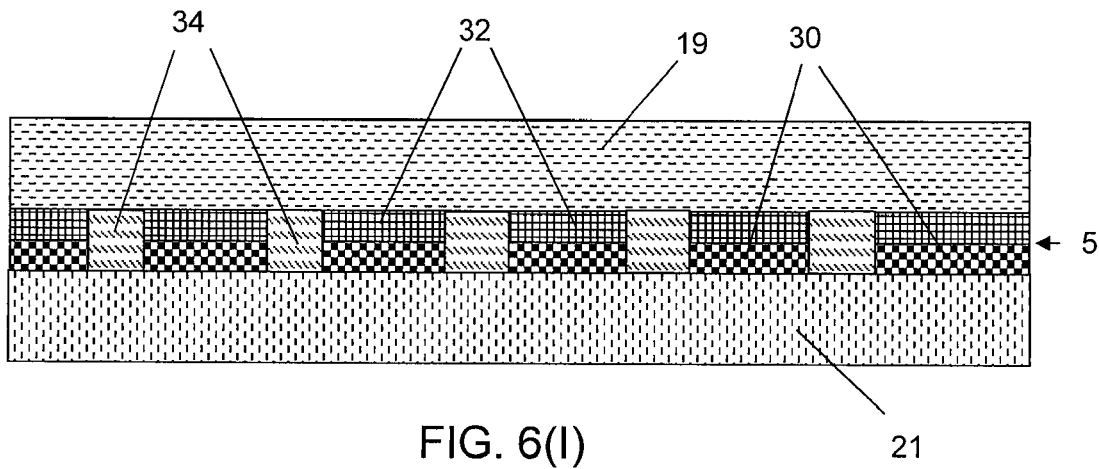

Referring to FIG. 6(I), the layer 19 on which the electrode 5 is disposed is fused or bonded to the second dielectric or semi-dielectric layer 21 to form a stack. In an embodiment, layer 21 may comprise an ultra low expansion material (such as ULE® material), a glass material, a ceramic material, a glass ceramic material (such as ZERODUR® material), or a combination thereof. In an embodiment, layer 21 comprises a glass and/or ceramic material.

With reference to FIGS. 5 and 6, the bonding method may comprise anodic bonding. In an embodiment, the first layer 19 is fused to the second layer 21, via the intermediate material 34 between the portions of the electrode 5. In an embodiment, fusing or bonding may be achieved by heating the stack until the material 19, 21 and 34 flows together at their interfaces. The bonding or fusing may comprise applying heat to the stack, applying pressure to the stack or a combination thereof. The temperature and/or pressure applied to the layer 19, the layer 21, the intermediate material 34 or the stack depends on the material used for the layer 19, the layer 21, the intermediate material 34 and the electrode 5.

With reference to FIGS. 5 and 6, it is seen that the process starts from and builds on the dielectric or semi-dielectric layer 19, which is the upper (first) layer 19 of the clamp 3. In an embodiment, the process may start from and/or build on the dielectric or semi-dielectric layer 21, which is the lower (second) layer 21 of the clamp 3.

An advantage of the clamp and/or method described herein is that alignment error and/or height error associated with electrode formation may be reduced or eliminated. Such error may have a negative impact on clamp performance such as pole to pole sparking and/or mortality issues. Additionally or alternatively, the clamp and/or method described herein may provide unexpected improved yield compared to electrode formation methods in the art. Additionally or alternatively, the clamp and/or method described herein may provide unexpected reduction in price and/or production time.

The mechanism or method of application of the various layers of material herein should not be limiting. For example, in an embodiment, one or more of the various layers, as appropriate, may be provided using a sputtering process, using a chemical vapor deposition process, or a combination thereof. In an embodiment, one or more of the various layers may be provided as a liquid (in combination with, e.g., a doctor blade). Additionally, etching may be performed any number of ways and should not be limiting. For example, in an embodiment, the etching may comprises a laser ablation process.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. Further, an electrostatic clamp as discussed herein may have other applications than in optical lithography. For example, the electrostatic clamp may be used to hold an article for chemical processing in an evacuated chamber.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. An apparatus having an electrostatic clamp configured to electrostatically clamp an article to an article support, the clamp comprising:
   a first dielectric or semi-dielectric layer;
   a second dielectric or semi-dielectric layer;
   an electrode between and in contact with the first and second dielectric or semi-dielectric layers to form a stack, the electrode comprising a first electrode layer and a second electrode layer, and having a first portion and a lateral second portion; and an intermediate material between the first and second portions, the intermediate material being a dielectric, semi-dielectric or isolating material from other than the first or the second dielectric or semi-dielectric layer.

2. The apparatus of claim 1, wherein the first dielectric or semi-dielectric layer, or the second dielectric or semi-dielectric layer, or both first and second layers comprise a glass material, or a ceramic material, or both glass and ceramic materials.

3. The apparatus of claim 1, wherein the intermediate material comprises silicon dioxide.

4. The apparatus of claim 1, wherein the first electrode layer comprises chrome and the second electrode layer comprises aluminum.

5. The apparatus of claim 1, further comprising an article support configured to hold a patterning device, or a radiation-sensitive substrate, or both.

6. An apparatus having an electrostatic clamp configured to electrostatically clamp an article to an article support, the clamp comprising:
   a first unitary dielectric or semi-dielectric layer;
   a second unitary dielectric or semi-dielectric layer;
   an electrode between and in contact with the first and second unitary dielectric or semi-dielectric layers, the electrode comprising a first electrode layer and a second electrode layer; and
   an intermediate material separate from the first and second unitary dielectric or semi-dielectric layers and extending between the first and second unitary dielectric or semi-dielectric layers to contact both the first and second unitary dielectric or semi-dielectric layers.

7. The apparatus of claim 6, wherein the intermediate material is a different substance than the material of the first and second unitary dielectric or semi-dielectric layers.

8. The apparatus of claim 6, wherein the intermediate material is bonded to both the first and second unitary dielectric or semi-dielectric layers.

9. The apparatus of claim 6, wherein the first and second unitary dielectric or semi-dielectric layers have a generally planar surface that interfaces with the electrode and the intermediate material.

10. The apparatus of claim 6, further comprising an article support configured to hold a patterning device, or a radiation-sensitive substrate, or both.

11. An electrostatic clamp configured to electrostatically clamp an article to an article support in a lithographic apparatus, the clamp comprising:
    a first layer of material;
    an electrode disposed over and in contact with the first layer, the electrode comprising a first electrode layer and a second electrode layer;
    an isolating, dielectric or semi-dielectric material deposited between portions of the electrode; and
    a second layer disposed over and in contact with the electrode.

12. A method of manufacturing an electrostatic clamp configured to electrostatically clamp an article to an article support, the method comprising:
    disposing an electrode between and in contact with a first and a second dielectric or semi-dielectric layer, the electrode comprising a first electrode layer and a second electrode layer, and having a first and a lateral second portion; and
    disposing an intermediate material between the first and second portions, the intermediate material being a dielectric, semi-dielectric or isolating material from other than the first or the second dielectric or semi-dielectric layer.

13. The method of claim 12, wherein disposing the electrode comprises providing a masking material having an aperture on or over the electrode and removing electrode material via the aperture to form the first and second portions.

14. The method of claim 12, wherein the electrode has a gap between the first and second portions and disposing the intermediate material between the first and second portions comprises depositing intermediate material into the gap.

15. The method of claim 12, further comprising bonding the intermediate material to both the first and second dielectric or semi-dielectric layers.

16. The method of claim 12, wherein the intermediate material is a different substance than the material of the first and second dielectric or semi-dielectric layers.

17. The method of claim 12, wherein the first dielectric or semi-dielectric layer, or the second dielectric or semi-dielectric layer, or both first and second layers comprise a glass material, or a ceramic material, or both glass and ceramic materials.

18. The method of claim 12, wherein disposing the electrode comprises depositing a layer of chrome and a layer of aluminium, and wherein the layer of chrome is the first electrode layer and the layer of aluminium is the second electrode layer.

19. An electrostatic clamp manufactured according to the method of claim 12.

20. A lithographic apparatus, comprising:
    a projection system configured to project a beam of radiation patterned using a patterning device onto a radiation sensitive substrate; and
    an electrostatic clamp to hold the substrate, or the pattering device, or both, the electrostatic clamp comprising
      a first dielectric or semi-dielectric layer,
      a second dielectric or semi-dielectric layer,
      an electrode between and in contact with the first and second dielectric or semi-dielectric layers to form a stack, the electrode comprising a first electrode layer and a second electrode layer, and having a first portion and a lateral second portion, and
      an intermediate material between the first and second portions, the intermediate material being a dielectric, semi-dielectric or isolating material from other than the first or the second dielectric or semi-dielectric layer.

* * * * *

UNITED STATES PATENT AND TRADEMARK OFFICE
CERTIFICATE OF CORRECTION

| | | |
|---|---|---|
| PATENT NO. | : 8,902,562 B2 | Page 1 of 1 |
| APPLICATION NO. | : 13/564316 | |
| DATED | : December 2, 2014 | |
| INVENTOR(S) | : Peter Richard Helmus et al. | |

It is certified that error appears in the above-identified patent and that said Letters Patent is hereby corrected as shown below:

On title page, Item (73) Assignee replace "ASML Holdings N.V."
with --ASML Holding N.V.--.

Signed and Sealed this
Tenth Day of March, 2015

Michelle K. Lee
*Deputy Director of the United States Patent and Trademark Office*